HIGH FREQUENCY DISCRIMINATOR

Filed July 19, 1965

INVENTOR.
MICHAEL O. FELIX
BY
[signature]
ATTORNEYS

United States Patent Office 3,383,608

Patented May 14, 1968

3,383,608
HIGH FREQUENCY DISCRIMINATOR

Michael O. Felix, San Carlos, Calif., assignor, by mesne assignments to International Telephone and Telegraph Corporation, a corporation of Delaware Filed July 19, 1965, Ser. No. 473,012
5 Claims. (Cl. 329—141)

Figure 1:
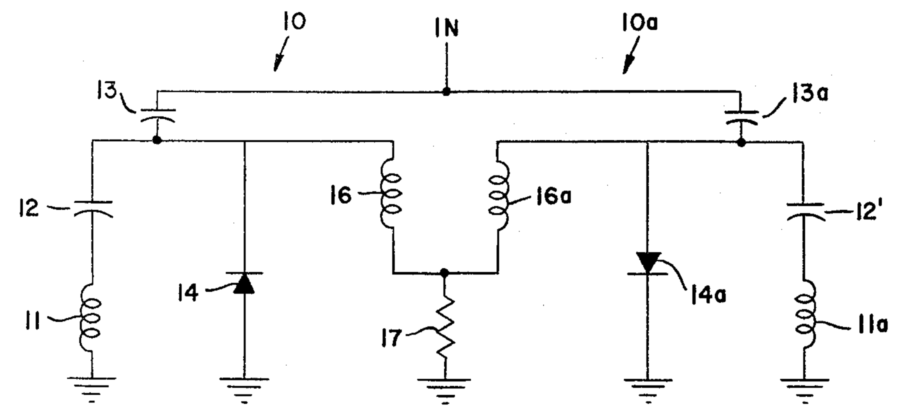

This invention relates to a high frequency discriminator and more particularly to a discriminator of the type having two tuned circuits, the circuits being tuned respectively above and below the center frequency of the discriminator to thereby form a phase-shift discriminator.

Frequency discriminators for high frequencies (for example, over 30 megacycles) are at the present time difficult to construct economically and at the same time maintain adequate sensitivity. This is especially true when the discriminator must feed a low impedance, current type load. With the advent of transistorization, the use of standard discriminators having parallel tuned circuits with a voltage output causes a loss of efficiency since the conversion from voltage to current is inefficient, especially at high frequencies where such conversion devices inevitably have excessive capacity. For higher frequencies of operation, it is also very difficult to find suitable diodes. Diodes which do have a very fast response as for example in the picosecond range (suitable for the higher frequencies) tend either to have a very low breakdown voltage or to be very costly.

Accordingly, it is an object of the present invention to provide an improved high frequency discriminator.

It is another object of the invention to provide a discriminator which is compatible with a low impedance load.

It is still another object of the invention to provide a discriminator of the above type which is both efficient and economical.

In accordance with the above objects, a discriminator is provided by the present invention which has two series resonant circuits. Each of these circuits includes a series connected inductance means and capacitance means, the circuits being respectively resonant at above and below the center of the discriminator frequency. Rectifiers are respectively series coupled to each resonant circuit, and input signal means are also coupled to such circuits. High frequency filters are respectively coupled to one side of the rectifiers. Finally, a common load having an A.C. impedance of less than the reactance of either the inductive means is connected to both filters.

Figure 2:
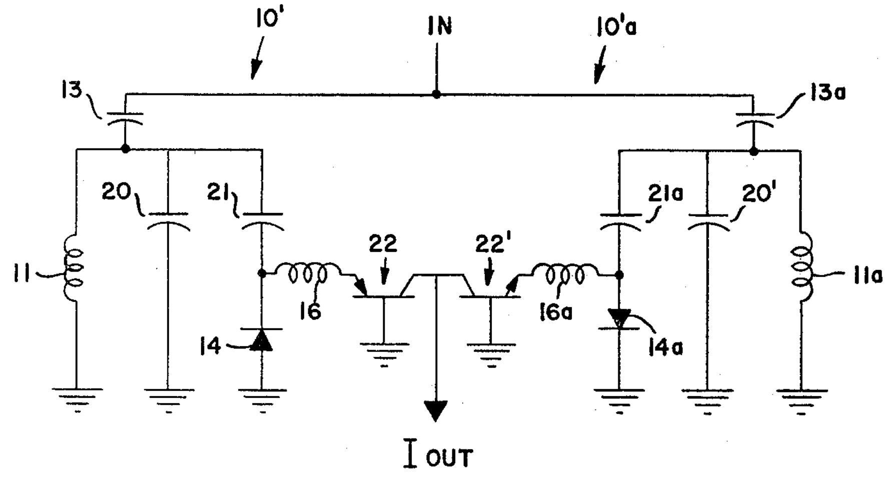

Referring to the drawing:

FIGURE 1 is a schematic circuit diagram of a high frequency discriminator constructed in accordance with the invention; and FIGURE 2 is a modification of FIGURE 1.

The discriminator of FIGURE 1 includes a first tuned circuit 10 and a second tuned circuit 10*a*, the circuits being tuned to frequencies above and below a predetermined center frequency in a manner well known in the art. Circuits 10 and 10*a* are identical in construction (excepting capacitance values) and thus only circuit 10 will be described, it being understood that circuit 10*a* would be identically described. The supscript *a* applies to all similar elements in tuned circuits 10*a*.

The circuit 10 includes series connected inductor 11 and capacitor 12 connected in a resonant circuit with the inductor 11 grounded. The circuit 11, 12 is resonant at one of the frequencies which is offset from the center frequency. Circuit 11*a*, 12' is resonant at the other frequency, the value of capacitor 12' being adjusted to change the resonant frequency of the network to the other offset frequency. An input signal is coupled to the resonant circuit 11, 12 by means of a coupling capacitor 13 which is of a relatively low value to minimize the loading on the resonant circuit and attendant reduction of Q. Coupling of the input signal may also be accomplished by an inductive link with inductor 11.

In series with resonant circuit 11, 12 is a rectifier 14 which is also grounded at its other terminal. Lastly, a high frequency filter or choke 16 which is series connected to a common load 17 is coupled to the common terminal of rectifier 14 and series resonant circuit 11, 12.

Load 17 has an A.C. impedance of less than the inductive reactance of inductor 11 to avoid both damping of the resonant circuit and a loss of rectification efficiency. In practice, a Q of at least 10 is desirable. Since Q is a ratio of inductive reactance and load resistance, the equality of these terms would produce a Q of 1 which in most cases is unsatisfactory. In any case, the load impedance for efficient circuit operation is less than 200 ohms. The load is common to both tuned circuits 10 and 10*a* and thus the total current flowing in the load represents, in accordance with established discriminator theory, an amplitude representation of the frequency information applied to the input of the frequency discriminator.

In operation, the input is coupled into both resonant circuits 11, 12, and 11*a*, 12', and the circulating current is rectified by rectifiers 14 and 14*a*, the rectified current flowing through the output load 17. The output current represents either the sum of the individual currents or the difference, depending on the connections of the individual rectifiers 14 and 14*a* FIGURES 1 and 2 illustrate a "difference" type of operation. High frequency chokes 16 and 16*a* effectively block the passage of almost all high frequency alternating current from the resonant circuit to the load.

With the foregoing current type discriminator, rectifiers 14 and 14*a* may be operated near their maximum current rating to provide for efficient coupling to a low impedance load. Generally, as the frequency capability of a device is increased, its voltage characteristics become more limited as compared to current parameters. Thus, by utilizing the current characteristics of the rectifier instead of voltage, greater efficiencies and economies are achieved. Moreover, since no conversion of voltage to current is necessary for matching to a low impedance load, the added losses of a converter component are eliminated.

FIGURE 2 is a modification of tuned circuits 10 and 10*a* of FIGURE 1 which minimizes the losses in the rectifiers 14 and 14*a* which in some situations will often be too great to allow their connection across the entire resonant circuit.

A lossy diode has the effect of adding series resistance to thereby reduce the Q of a resonant circuit. In accordance with the invention, capacitor 12 of FIGURE 1 is modified and split into two legs 20 and 21. The capacitance value of capacitor 20 is made several times larger than that of 21 so that the greatest amount of current flows in the leg containing capacitor 20 and a smaller amount in the leg containing capacitor 21. Rectifier 14 is coupled in the low current carrying leg and thus any loss in the rectifier is minimized.

Another modification of the present invention for optimizing the performance of the current discriminator is also illustrated in FIGURE 2. The load into which the output current of the discriminator flows must be small so as to maintain rectification efficiency and reduce damping of the series resonant circuit. Accordingly, the output current is fed into the emitter of a grounded base PNP type transistor 22 for tuned circuit 10' and the emitter of a grounded base NPN type transistor 22' for tuned circuit 10'*a*. With the common base configuration, there will be an input emitter to base impedance of normally less than 200 ohms which amply satisfies the requirements of the tuned circuits.

A discriminator of the type shown in FIGURE 2 with minor modifications was constructed. The following table lists the various values of the components and circuit characteristics:

| | |
|---|---|
| Inductors 11, 11*a*, ____________microhenrys__ | .03 |
| Capacitors 13, 13*a* ________________________ | (1) |
| Capacitor 20 _________________picofarads__ | 9 |
| Capacitor 20′ ______________________do____ | 11 |
| Capacitors 21, 21*a* __________________do____ | 1 |
| Diodes 14, 14*a* ___________________________ | (2) |
| Inductors 16, 16*a* _____________microhenrys__ | 0.3 |
| Transistor 22 ____________________________ | 2N2894 |
| Transistor 22′ ___________________________ | 2N2369 |
| Center frequency ______________megacycles__ | 300 |
| Q _____________________________________ | 10 |
| Sensitivity ______________________ma./mc.__ | 5 |

1 Fraction of a picofarad.
2 Hewlett-Packard hot carrier diode type 1N2101.

Thus, the above invention provides an improved high frequency discriminator which provides an efficient and economical input for a low impedance load.

I claim:

1. A high frequency discriminator comprising first and second series resonant circuits, each of such circuits including series connected inductive and capacitive means, one of said circuits being resonant at a frequency above a center frequency, and the other of said circuits being resonant at a frequency below such center frequency, rectifiers respectively connected in series to each of said resonant circuits, input signal means coupled to said resonant circuits, high frequency filters respectively coupled to one side of each of said rectifiers, and a load common to both of said circuits coupled to said filters of said first and second circuits, said load having an A.C. impedance of less than the reactive impedance of either of said inductive means.

2. A high frequency discriminator according to claim 1 in which said load impedance is less than 200 ohms.

3. A high frequency discriminator as in claim 1 where said capacitive means is divided into two parallel legs each including a capacitor, and one of said parallel legs including said rectifier.

4. A high frequency discriminator as in claim 3 where said capacitor in said leg which includes said rectifier is several times smaller in capacitance value relative to said capacitor in said other leg.

5. A high frequency discriminator as in claim 1 where said load includes the emitter to base resistance of a grounded base transistor.

No references cited.

ALFRED L. BRODY, *Primary Examiner.*